United States Patent
Wang

(10) Patent No.: US 12,062,558 B2
(45) Date of Patent: Aug. 13, 2024

(54) TREATMENT METHOD AND TREATMENT DEVICE FOR OOC ACTION DURING SEMICONDUCTOR PRODUCTION PROCESS

(71) Applicant: CHANGXIN MEMORY TECHNOLOGIES, INC., Hefei (CN)

(72) Inventor: Jun Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 157 days.

(21) Appl. No.: 17/446,416

(22) Filed: Aug. 30, 2021

(65) Prior Publication Data

US 2022/0285187 A1 Sep. 8, 2022

Related U.S. Application Data

(63) Continuation of application No. PCT/CN2021/103577, filed on Jun. 30, 2021.

(30) Foreign Application Priority Data

Mar. 4, 2021 (CN) .......................... 202110240525.2

(51) Int. Cl.
 *H01L 21/67* (2006.01)
 *G05B 19/418* (2006.01)
 *G05B 23/02* (2006.01)

(52) U.S. Cl.
 CPC .... *H01L 21/67276* (2013.01); *G05B 19/4184* (2013.01); *G05B 23/0259* (2013.01)

(58) Field of Classification Search
 None
 See application file for complete search history.

(56) References Cited

U.S. PATENT DOCUMENTS

| | | | |
|---|---|---|---|
| 7,117,058 B2 | 10/2006 | Lin | |
| 8,756,028 B2 | 6/2014 | Chu | |
| 10,726,192 B2 | 7/2020 | Leu et al. | |
| 2004/0158344 A1 | 8/2004 | Inobe et al. | |
| 2012/0330591 A1 | 12/2012 | Chu | |
| 2020/0026819 A1 | 1/2020 | Leu et al. | |
| 2021/0325859 A1 | 10/2021 | Yan | |

FOREIGN PATENT DOCUMENTS

| | | |
|---|---|---|
| CN | 103885423 A | 6/2014 |
| CN | 106298582 A | 1/2017 |
| CN | 110907135 A | 3/2020 |
| CN | 113053786 A | 6/2021 |
| TW | 200415495 A | 8/2004 |
| TW | 201301074 A | 1/2013 |

*Primary Examiner* — Carlos R Ortiz Rodriguez
(74) *Attorney, Agent, or Firm* — Syncoda LLC; Feng Ma

(57) ABSTRACT

A treatment method for an OOC action during a semiconductor production process includes: multiple Out Of Control Action Plan IDs (OCAPID) respectively corresponding to multiple semiconductor production process steps and multiple identified contents in one-to-one correspondence with the multiple OCAPIDs are established, and an OOC action checklist including multiple OOC action check items according to the identified contents is established; it is determined whether the OOC action occurs to a wafer subjected to the current semiconductor production process step, and if the OOC action occurs to the wafer, the current OCAPID corresponding to the current semiconductor production process step is automatically obtained, and the wafer is inspected according to the current identified content corresponding to the current OCAPID.

20 Claims, 6 Drawing Sheets

Multiple OCAPIDs respectively corresponding to multiple semiconductor production process steps and multiple identified contents in one-to-one correspondence with the multiple OCAPIDs are established, and an OOC action checklist including multiple OOC action check items is established according to the identified contents — S11

It is determined whether the OOC action occurs to a wafer subjected to a current semiconductor production process step, if the OOC action occurs to the wafer, a current OCAPID corresponding to the current semiconductor production process step is automatically obtained — S12

The wafer is inspected according to a current identified content corresponding to the current OCAPID — S13

TREATMENT METHOD AND TREATMENT DEVICE FOR OOC ACTION DURING SEMICONDUCTOR PRODUCTION PROCESS

CROSS-REFERENCE TO RELATED APPLICATIONS

This application is a continuation of International Application No. PCT/CN2021/103577 filed on Jun. 30, 2021, which claims priority to Chinese Patent Application No. 202110240525.2 filed on Mar. 4, 2021. The disclosures of these applications are hereby incorporated by reference in their entirety.

BACKGROUND

In a semiconductor production process, not only the process steps are complex, but also the higher process accuracy is required. In order to monitor the semiconductor production process and timely find problems or make an improvement for a process technology, in each production process, an Out Of Control (OOC) action is detected by collecting measurement data and monitoring a current production process state using Statistical Process Control (SPC), and then the OOC action is fed back to a Manufacturing Execution System (MES) so that a corresponding action is performed on a product or a machine. Specifically, an engineer controls the MES according to a Standard Operating Procedure (SOP) to perform a corresponding action on a product subjected to the OOC action.

SUMMARY

The disclosure relates generally to the field of semiconductor manufacturing technologies, and more specifically to a treatment method and a treatment device for an OOC action during a semiconductor production process.

The embodiments of the disclosure provide a treatment method and a treatment device.

Embodiments of the disclosure provide a treatment method for an OOC action during a semiconductor production process, including the following steps. Multiple Out Of Control Action Plan IDs (OCAPID) respectively corresponding to multiple semiconductor production process steps and multiple identified contents in one-to-one correspondence with the multiple OCAPIDs are established, and an OOC action checklist including multiple OOC action check items is established according to the identified contents. Whether the OOC action occurs to a wafer subjected to the current semiconductor production process step is determined, and if the OOC action occurs to the wafer, the current OCAPID corresponding to the current semiconductor production process step is automatically obtained. The wafer is inspected according to the current identified content corresponding to the current OCAPID.

Embodiments of the disclosure further provide a treatment device for an OOC action during a semiconductor production process, including a memory storing processor-executable instructions; and a processor configured to execute the stored processor-executable instructions to perform operations of: establishing a plurality of OOC Action Plan Identifications (OCAPIDs) respectively corresponding to a plurality of semiconductor production process steps and a plurality of identified contents in one-to-one correspondence with the plurality of OCAPIDs, and establishing an OOC action checklist comprising a plurality of OOC action check items according to the identified contents; determining whether the OOC action occurs to a wafer subjected to a current semiconductor production process step, and if the OOC action occurs to the wafer, automatically obtaining a current OCAPID corresponding to the current semiconductor production process step; and inspecting the wafer according to a current identified content corresponding to the current OCAPID.

DETAILED DESCRIPTION

Some important confirmation items may be omitted when the engineer treats an OOC action artificially, therefore a released product may affect implementation of a subsequent process smoothly. Moreover, since there are too many SOPs, the SOP referred by the engineer when treating the OOC action artificially may be not consistent with a corresponding production process of the product subjected to OOC, thereby causing a wrong conclusion. In addition, when the engineer checks the OOC action artificially according to the SOP, no corresponding record may be inquired, which is not beneficial to subsequent tracking. The current treatment on the OOC action needs to perform operations, such as increasing quantity, addition of scanning and releasing, then the engineer and the product need to shuttle among the machines, so it is time-consuming and labor-consuming.

Various embodiments of the present disclosure can address how to improve the treatment efficiency for the OOC action during the semiconductor production process, improve the reliability of the treatment result of the OOC action, reduce human cost and reduce the error caused by subjective factors of human.

Specific embodiments of a treatment method and a treatment device for an OOC action during a semiconductor production process provided by the disclosure are described in details below in combination with drawings.

Figure 1:
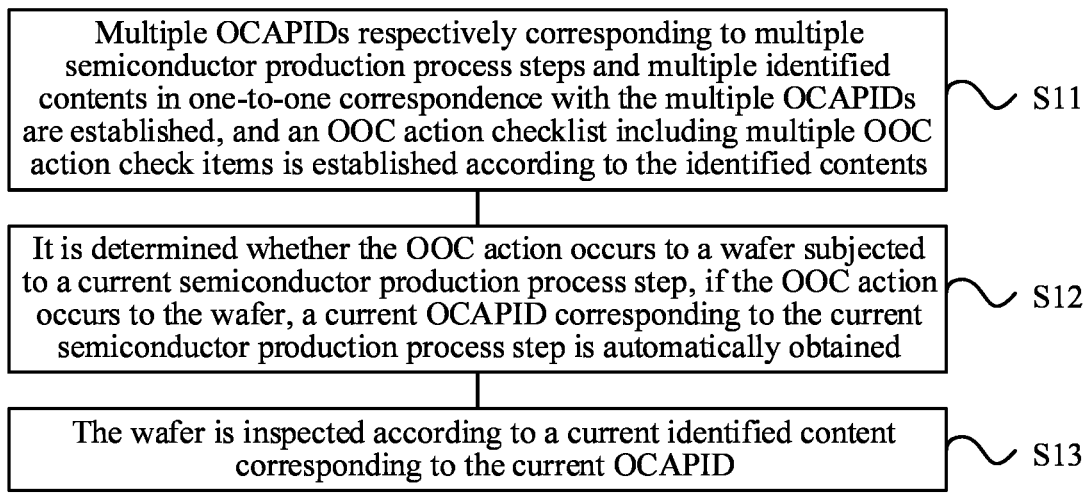
FIG. 1 is a flow chart of a treatment method for an OOC action during a semiconductor production process according to specific embodiments of the disclosure.

Specific embodiments provide a treatment method for an OOC action during a semiconductor production process. FIG. 1 is a flow chart of a treatment method for an OOC action during a semiconductor production process according to specific embodiments of the disclosure. As shown in FIG. 1, the treatment method for an OOC action during a semiconductor production process includes the following steps.

In S11, multiple OCAPIDs respectively corresponding to multiple semiconductor production process steps and multiple identified contents in one-to-one correspondence with the multiple OCAPIDs are established, and an OOC action checklist including multiple OOC action check items is established according to the identified contents.

In a manufacturing process of a semiconductor product, a wafer needs to be treated through the multiple semiconductor production process steps. The operation of establishing multiple OCAPIDs respectively corresponding to multiple semiconductor production process steps may be establishing an OCAPID for each semiconductor production process step, and may also be establishing multiple OCAPIDs for each semiconductor production process step, for example, OCAPIDs are respectively established for a hard device and a process method used for each semiconductor production process step. Those skilled in the art can set the specific forms of the OCAPIDs according to actual needs as long as implementing a correspondence between the semiconductor production process and the OCAPID. In this specific embodiment, "a plurality of" refers two or above.

Optionally, the specific step of establishing multiple OCAPIDs respectively corresponding to multiple semiconductor production process includes the following operation.

An OCAPID is established for process items required to be treated by a same SOP in each semiconductor production process step.

Figure 2:
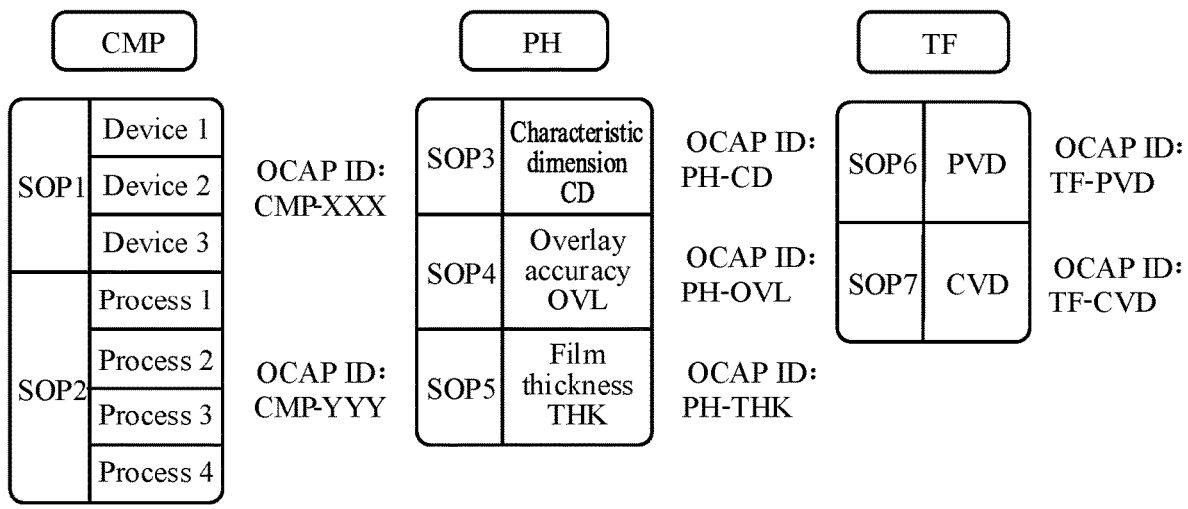
FIG. 2 is a schematic diagram for establishing an OCAPID according to specific embodiments of the disclosure.

FIG. 2 is a schematic diagram for establishing an OCAPID according to specific embodiments of the disclosure. Specifically, in order to further simplify a treatment method for an OOC action, this embodiment establishes an OCAPID for the process item treated by SOP in each semiconductor production process step. For example, as shown in FIG. 2, when the semiconductor production process step is CMP, a device 1, a device 2 and a device 3 in the CMP step need to adopt SOP1 for treatment. Therefore, for the process item, the device 1, the device 2 and the device 3 establish an OCPAID CMP-XXX together. A process 1, a process 2, a process 3 and a process 4 in the CMP step need to adopt SOP2 for treatment, so, for the process item, the process 1, the process 2, the process 3 and the process 4 establish an OCPAID CMP-YYY together. For another example, as shown in FIG. 2, when the semiconductor production process step is photoetching (PH), an OCPAID PH-CD is established for the process item related to a characteristic dimension (CD), an OCPAID PH-OVL is established for the process item related to overlay accuracy (OVL), and an OCPAID PH-THK is established for the process item related to a film thickness (THK). For another example, as shown in FIG. 2, when the semiconductor production process is a Thin film Forming (TF) step, an OCPAID TF-PVD is established for the process item related to Physical Vapor Deposition (PVD), and an OCPAID TF-CVD is established for the process item related to Chemical Vapor Deposition (CVD). The process item in this specific embodiment may include one or any combination of: the device, the process method, the semiconductor characteristic parameters (such as characteristic dimension, overlay precision and film thickness) used in the semiconductor production process step.

Optionally, the OCPAID includes a first part and a second part, where the first part is a name of the semiconductor production process step, and the second part is a name of each of the process items required to be treated by the same SOP.

Specifically, by setting the OCPAID to include the name of the semiconductor production process step and the name of each of the process items required to be treated by the same SOP, an engineer may be enabled to directly and quickly understand the meaning represented by the OCPAID and avoid mistakes and omissions during work.

Optionally, the operation that multiple OCPAIDs respectively corresponding to multiple semiconductor production process steps and multiple identified contents in one-to-one correspondence with the OCPAIDs are established, and an OOC action checklist including multiple OOC action check items is established according to the identified contents includes the following specific operations.

The OOC action checklist is established according to SOP corresponding to the OCPAIDs, and the OOC action checklist includes multiple check items and multiple check sub-items corresponding to each check item that are orderly arranged.

Multiple reason classifications that correspond to the multiple check items in the OOC action checklist are established.

An execution action list that corresponds to the OOC action checklist is established, and the execution action list includes multiple execution actions corresponding to the multiple reason classifications.

Figure 3:
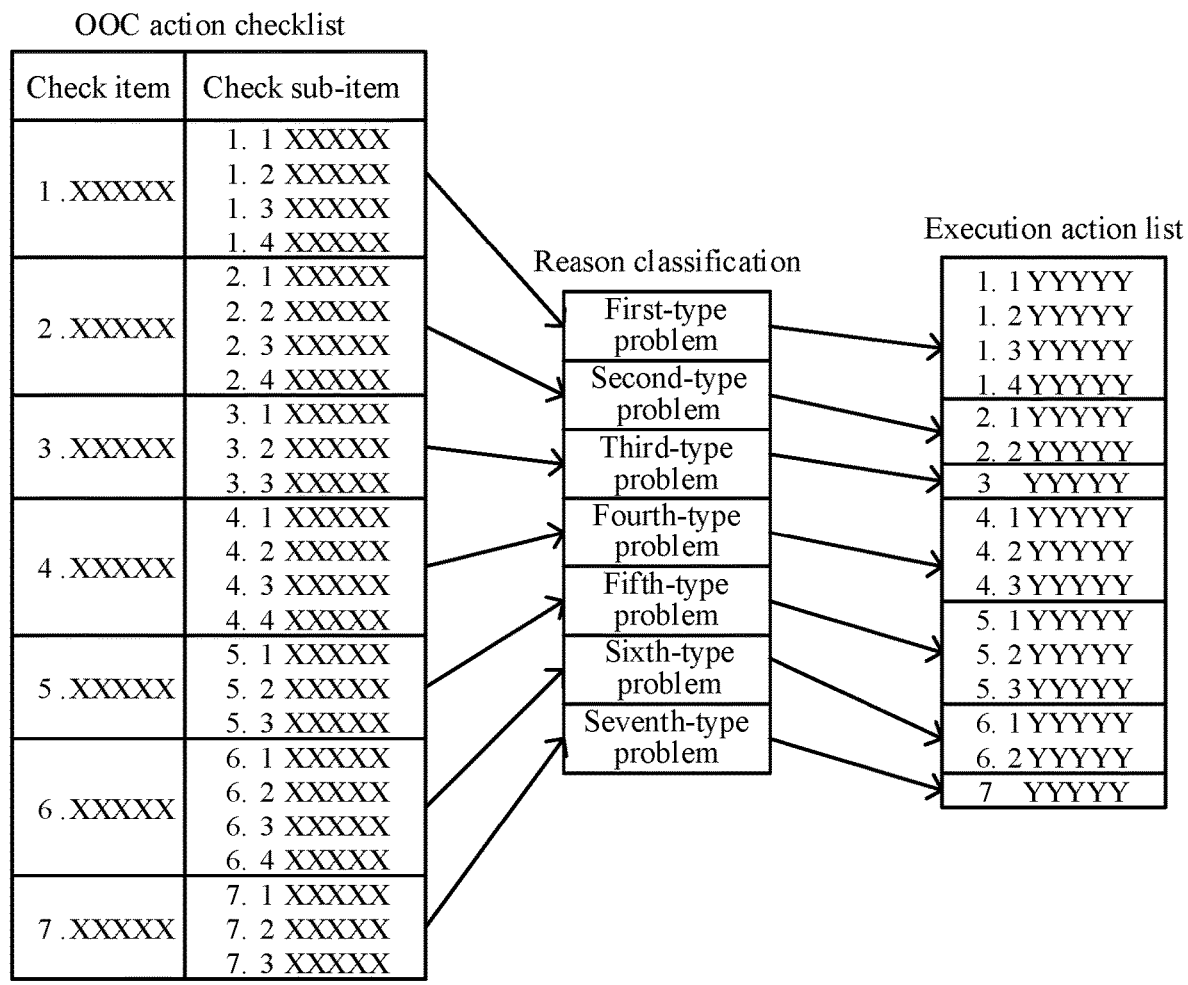
FIG. 3 is schematic diagram showing a relationship among an OOC action checklist, a reason classification and an execution action according to specific embodiments of the disclosure.

FIG. 3 is schematic diagram showing a relationship among an OOC action checklist, a reason classification and an execution action according to specific embodiments of the disclosure. Specifically, as shown in FIG. 3, an OOC action checklist corresponding to each OCPAID is established for each OCPAID. If one OCAPID is established for process items required to be treated by a same SOP in each semiconductor production process step, the checklist corresponding to the OCAPID may be the SOP corresponding to the OCAPID. The checklist includes multiple check items and check sub-items corresponding to each of the check items. For example, the check item 1 is to check whether a measurement machine has a problem, the check sub-item corresponding to the check item 1 includes: 1.1 checking original data of each single-point measurement value, 1.2 checking a measurement position and alignment condition of a Goodness Of Fit (GOF) value, 1.3 checking a measurement image, and 1.4 checking whether there is data missing.

Establishing the multiple reason classifications in one-to-one correspondence with the multiple check items in each OOC action checklist are established is convenient to subsequently confirm a check item resulting in the OOC action, and control an MES to perform a corresponding action. For example, when the check item checks whether the measurement machine has a problem, the reason classification corresponding to the check item is a measurement problem, and the execution action corresponding to the check item includes repeat measurement, adjustment of measurement accuracy of a measurement device, and the like. When the check item checks whether the wafer is an experiment product, the reason classification corresponding to the check item is an engineering test batch problem, and the execution action corresponding to the check item includes reworking. When the check item checks whether a front production process has a problem, the reason classification corresponding to the check item is a front production process problem, and the execution action corresponding to the check item includes informing the engineer.

In S12, it is determined whether the OOC action occurs to a wafer subjected to a current semiconductor production process step is, and if the OOC action occurs to the wafer, the current OCAPID corresponding to the current semiconductor production process step is automatically obtained.

Optionally, the operation that whether the OOC action occurs to the wafer subjected to the current semiconductor production process step is determined specifically includes the following operation.

It is determined whether the measurement result of the wafer subjected to the current semiconductor production process step is in a threshold range monitored through SPC, and if the measurement result is not in the threshold range, it is confirmed that the OOC action occurs to the wafer subjected to the current semiconductor production process step.

Figure 4:
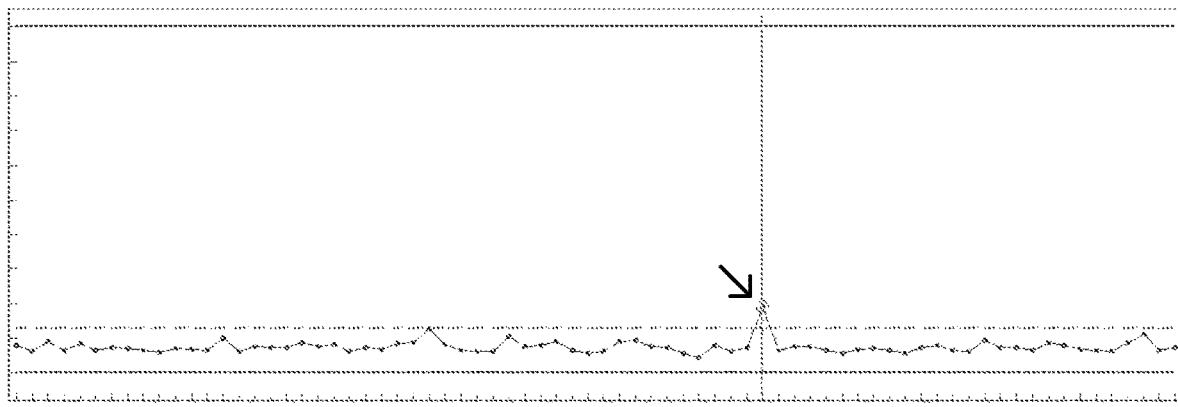
FIG. 4 is a schematic diagram of an SPC system in a semiconductor production process according to specific embodiments of the disclosure.

FIG. 4 is a schematic diagram of an SPC system in a semiconductor production process according to specific embodiments of the disclosure. Specifically, during a semiconductor manufacturing process, the process state is monitored in real time through SPC. The OCAPIDs corresponding to the multiple semiconductor production process steps are bundled in SPC. When the OOC action occurs to the current semiconductor production process step, for example, a position indicated by an arrow in FIG. 4 is abnormal, the OCAPID corresponding to the current semiconductor production process step is quickly and automatically obtained, thereby effectively avoiding an error caused by artificial searching for an SOP related to the current semiconductor production process step.

Optionally, after confirming that the OOC action occurs to the wafer subjected to the current semiconductor production process step, the method further includes the following steps.

The related information of the wafer is displayed, where the related information includes one or any combination of: a time when occurrence of the OOC action is confirmed, a production process station for which occurrence of the OOC action is confirmed, a measurement station where occurrence of the OOC action is confirmed, a current OCAPID corresponding to the current semiconductor production process step and SPC information of the wafer.

In order to make it easier for the engineer to understand the related conditions of the wafer to which the OOC action occurs and provide a reference for treating the subsequent OOC actions, the related information of the wafer may be displayed in a display panel after confirming that the OOC action occurs to the wafer subjected to the current semiconductor production process step. The display manner may be text display, image display or display combining text and image.

In S13, the wafer is inspected according to a current identified content corresponding to the current OCAPID.

Optionally, the operation that the wafer is inspected according to the current identified content corresponding to the current OCAPID includes the following operations.

The OOC action check items in the OOC action checklist are sequentially performed to obtain the target check item resulting in occurrence of the wafer OOC action.

The target reason classification corresponding to the target check item is searched for, and the execution action corresponding to the target reason classification is performed.

Specifically, after it is confirmed that the OOC action occurs to the wafer subjected to the current semiconductor production process step and the current OCAPID is obtained, the OOC action may be checked according to the OOC action checklist corresponding to the current OCAPID. Multiple OOC action check items logically arranged are in the OOC action checklist, for example, firstly checking whether the OOC action is caused by the problem of the measurement machine, and then confirming whether the OOC action is caused by the experiment batch, finally confirming whether the OOC action is caused by the production process problem. The OOC action check items in the OOC action checklist are performed sequentially until the check item causing the current OOC action is confirmed, and the check item causing the current OOC action is used as the target check item. In another example, those skilled in the art can set other sequences according to actual needs to perform various OOC action check items in the OOC action checklist.

Optionally, after the wafer is inspected according to the current identified content corresponding to the current OCAPID, the method further includes the following steps.

The MES is controlled to perform a corresponding action on the wafer according to an inspection result of the wafer.

Specifically, after confirming the target check item, the MES may be automatically controlled to perform the corresponding action according to a relationship among the target check item, the target reason classification and the target execution action.

In order to conveniently inquire the related information for treating the OOC action subsequently, optionally, after performing the execution action corresponding to the target reason classification, the method further includes the following step.

The current semiconductor production process step, the current OCAPID, the target check item, the target reason classification and the execution action are stored.

Optionally, the treatment method for an OOC action during a semiconductor production process further includes the following step.

Statistics collection is performed on historical data of the wafer indicating occurrence of one or more OOC actions in the semiconductor production process steps, where the historical data includes a probability of occurrence of the OOC action of the wafer resulted from each OOC action check item in each semiconductor production process step.

Specifically, through performing statistics collection on historical data of the wafer indicating occurrence of one or more OOC actions in the semiconductor production process steps and obtaining the times of the OOC action caused by each OOC action check item in the semiconductor production process step, the probability of occurrence of the OOC action of the wafer resulted from each OOC action check item in each semiconductor production process step is calculated, so as to provide a reference for treating the current OOC action, so that the engineer may make a better improvement to the production process step.

Figure 5:
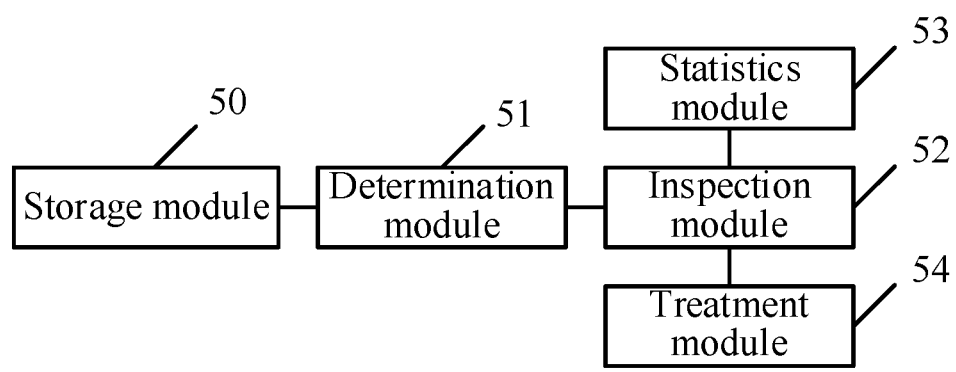
FIG. 5 is a structural block diagram of a treatment device for an OOC action during a semiconductor production process according to specific embodiments of the disclosure.

Moreover, specific embodiments further provide a treatment device for an OOC action during a semiconductor production process. FIG. 5 is a structural block diagram of a treatment device for an OOC action during a semiconductor production process according to specific embodiments of the disclosure. The treatment device for the OOC action during the semiconductor production process provided by this specific embodiment may adopt the method as shown in FIG. 1-FIG. 4 to treat the OOC action in the semiconductor production process. As shown in FIG. 5, the treatment device for the OOC action during the semiconductor production process includes a storage module 50 and a determination module 51

The storage module 50 is configured to establish and store multiple OCAPIDs respectively corresponding to multiple semiconductor production process steps and multiple identified contents in one-to-one correspondence with the multiple OCAPIDs, and establish an OOC action checklist including multiple OOC action check items according to the identified contents.

The determination module 51 is configured to determine whether the OOC action occurs to a wafer subjected to the current semiconductor production process step, and if the OOC action occurs to the wafer, automatically obtain a current OCAPID corresponding to the current semiconductor production process step.

The inspection module 52 is configured to inspect the wafer according to a current identified content corresponding to the current OCAPID.

Optionally, the storage module 50 is configured to establish an OCAPID for process items required to be treated by a same SOP in each semiconductor production process.

Optionally, the OCPAID includes a first part and a second part, the first part being a name of the semiconductor production process step, and the second part being a name of each of the process items required to be treated by the same SOP.

Optionally, the storage module 50 is configured to: establish the OOC action checklist according to an SOP corresponding to the OCPAIDs, where the OOC action checklist includes multiple check items arranged sequentially and multiple check sub-items corresponding to each check item; establish multiple reason classifications in one-to-one correspondence with the multiple check items in each OOC action checklist; and establish an execution action list that corresponds to each OOC action checklist, the execution action list including multiple execution actions respectively corresponding to the multiple reason classifications.

Optionally, the determination module 51 is configured to determine whether the measurement result of the wafer subjected to the current semiconductor production process is in a threshold range monitored through SPC, and if the measurement result is not in the threshold range, confirm that the OOC action occurs to the wafer subjected to the current semiconductor production process step.

Optionally, the determination module 51 is also configured to display related information of the wafer, where the related information include one or any combination of: a time when occurrence of the OOC action is confirmed, a production process station for which occurrence of the OOC action is confirmed, a measurement station where occurrence of the OOC action is confirmed, a current OCAPID corresponding to the current semiconductor production process step and SPC information of the wafer.

Optionally, the inspection module 52 is configured to sequentially perform the OOC action check item in the OOC action checklist so as to obtain the target check item resulting in occurrence of the wafer OOC action, search for the target reason classification corresponding to the target check item, and perform the execution action corresponding to the target reason classification.

Optionally, the treatment device for the OOC action during the semiconductor production process further includes a treatment module 54.

The treatment module 54 is configured to control the MES to perform a corresponding action on the wafer according to an inspection result of the wafer.

Optionally, the storage module 50 is further configured to store the current semiconductor production process step, the current OCAPID, the target check item, the target reason classification and the execution action after the inspection module 52 performs the execution action corresponding to the target reason classification.

Optionally, the treatment device for the OOC action during the semiconductor production process further includes a Statistics module 53.

The Statistics module 53 is configured to perform statistics collection on historical data of the wafer indicating occurrence of one or more OOC actions in the semiconductor production process steps, where the historical data includes a probability of occurrence of the OOC action of the wafer resulted from each OOC action check item in each semiconductor production process step.

Figure 6:
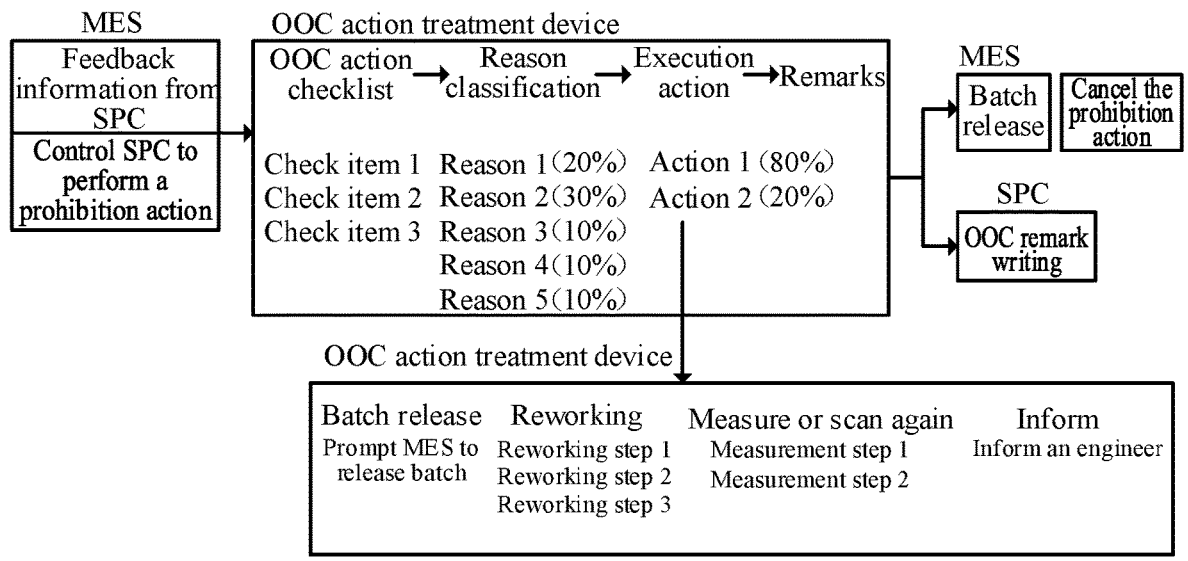
FIG. 6 is a relationship diagram between the treatment device for an OOC action during a semiconductor production process and an MES and SPC system according to specific embodiments of the disclosure.

FIG. 6 is a relationship diagram between the treatment device for an OOC action during a semiconductor production process and MES and SPC according to specific embodiments of the disclosure. As shown in FIG. 6, the process state is monitored in real time through SPC, and the monitoring information is fed back to the MES. The current OCAPID corresponding to the current semiconductor production process step is bundled in SPC. When the MES confirms that the received SPC feedback information includes OOC action information, the OOC action information is transmitted to the OOC action treatment device, and the OOC action treatment device displays the related information related to the current wafer in the MES, the related information including one or any combination of: a time when occurrence of the OOC action is confirmed, a production process station for which occurrence of the OOC action is confirmed, a measurement station where occurrence of the OOC action is confirmed, a current OCAPID corresponding to the current semiconductor production process step and SPC information of the wafer. The OOC action treatment device inspects the wafer to which the OOC action occurs through obtaining the current identified content corresponding to the current OCAPID, matches the corresponding target reason classification according to an inspection result and matches the corresponding target execution action according to the target reason classification. The matched target execution action is fed back to the MES and the SPC through the OOC action treatment device, and then the MES performs a corresponding prohibition action or releases the wafer according to an inspection result. Furthermore, the OOC action treatment device further writes contents, such as the current semiconductor production process step, the current OCAPID, the target check item, the target reason classification and the execution action, into the MES and the SPC for subsequent inquiring. In the OOC action treatment device, a corresponding specific execution step is set for each execution action, for example, the operation steps corresponding to the reworking action include a reworking step 1, a reworking step 2 and a reworking step 3.

The treatment method and the treatment device for the OOC action during the semiconductor production process provided by the specific embodiment establish multiple OCAPIDs respectively corresponding to multiple semiconductor production process steps and multiple identified contents in one-to-one correspondence with the multiple OCAPIDs. After the OOC action occurs to the wafer, the wafer can be quickly inspected according to the identified contents through obtaining the current OCAPID, it is thus possible to improve the treatment efficiency of the OOC action in the semiconductor production process, improve the reliability of the treatment result of the OOC action, reduce human cost during the OOC action treatment process and reduce the influence of the subjective factors of human on the OOC action treatment result.

The abovementioned embodiments are only preferred embodiments of the disclosure. It should be noted that those of ordinary skill in the art can make several improvements and modifications without departing from the principle of the disclosure, and these improvements and modifications should fall in the protection scope of the disclosure.

What is claimed is:

1. A treatment method for an Out Of Control (OOC) action during a semiconductor production process, the method comprising:

establishing a plurality of OOC Action Plan Identifications (OCAPIDs) corresponding to a plurality of semiconductor production process steps and a plurality of identified contents in one-to-one correspondence with the plurality of OCAPIDs, and establishing an OOC action checklist comprising a plurality of OOC action check items according to the identified contents;

determining whether the OOC action occurs to a wafer subjected to a current semiconductor production process step, and if the OOC action occurs to the wafer, automatically obtaining a current OCAPID corresponding to the current semiconductor production process step; and inspecting the wafer according to a current identified content corresponding to the current OCAPID.

2. The treatment method for an OOC action during a semiconductor production process of claim 1, wherein said establishing the plurality of OCAPIDs corresponding to the plurality of semiconductor production process steps specifically comprises:

establishing an OCAPID for process items required to be treated by a same Standard Operating Procedure (SOP) in each semiconductor production process step.

3. The treatment method for an OOC action during a semiconductor production process of claim 2, wherein the OCPAID comprises a first part and a second part, the first part being a name of the semiconductor production process step, and the second part being a name of each of the process items required to be treated by the same SOP.

4. The treatment method for an OOC action during a semiconductor production process of claim 2, wherein said establishing the plurality of OCPAIDs corresponding to the plurality of semiconductor production process steps and the plurality of identified contents in one-to-one correspondence with the OCPAIDs, and establishing the OOC action checklist comprising the plurality of OOC action check items according to the identified contents specifically comprises:

establishing the OOC action checklist according to an SOP corresponding to the OCPAIDs, wherein the OOC action checklist comprises a plurality of check items arranged sequentially and a plurality of check sub-items corresponding to each check item;

establishing a plurality of reason classifications in one-to-one correspondence with the plurality of check items in the OOC action checklist; and establishing an execution action list that corresponds to each OOC action checklist, the execution action list comprising a plurality of execution actions respectively corresponding to the plurality of reason classifications.

5. The treatment method for an OOC action during a semiconductor production process of claim 1, wherein said determining whether the OOC action occurs to the wafer subjected to the current semiconductor production process step specifically comprises:

determining whether a measurement result of the wafer subjected to the current semiconductor production process is in a threshold range monitored through a Statistical Process Control (SPC) system, and if the measurement result is not in the threshold range, confirming that the OOC action occurs to the wafer subjected to the current semiconductor production process step.

6. The treatment method for an OOC action during a semiconductor production process of claim 5, further comprising: after confirming that the OOC action occurs to the wafer subjected to the current semiconductor production process step, displaying related information of the wafer, wherein the related information comprises one or any combination of: a time when occurrence of the OOC action is confirmed, a production process station for which occurrence of the OOC action is confirmed, a measurement station where occurrence of the OOC action is confirmed, a current OCAPID corresponding to the current semiconductor production process step and SPC information of the wafer.

7. The treatment method for an OOC action during a semiconductor production process of claim 4, wherein said inspecting the wafer according to the current identified content corresponding to the current OCAPID specifically comprises:

sequentially performing the OOC action check items in the OOC action checklist, to obtain a target check item resulting in occurrence of the OOC action; and searching for target reason classification corresponding to the target check item, and performing an execution action corresponding to the target reason classification.

8. The treatment method for an OOC action during a semiconductor production process of claim 1, further comprising: after inspecting the wafer according to the current identified content corresponding to the current OCAPID, controlling a Manufacturing Execution System (MES) to perform a corresponding action on the wafer according to an inspection result of the wafer.

9. The treatment method for an OOC action during a semiconductor production process of claim 7, further comprising: after performing the execution action corresponding to the target reason classification, storing the current semiconductor production process step, the current OCAPID, the target check item, the target reason classification and the execution action.

10. The treatment method for an OOC action during a semiconductor production process of claim 1, further comprising:

performing statistics collection on historical data of the wafer indicating occurrence of one or more OOC actions in the semiconductor production process steps, wherein the historical data comprises a probability of occurrence of the OOC action of the wafer resulted from each OOC action check item in each semiconductor production process step.

11. A treatment device for an Out Of Control (OOC) action during a semiconductor production process, the device comprising:

a memory storing processor-executable instructions; and a processor configured to execute the stored processor-executable instructions to perform operations of:

establishing a plurality of OOC Action Plan Identifications (OCAPIDs) corresponding to a plurality of semiconductor production process steps and a plurality of identified contents in one-to-one correspondence with the plurality of OCAPIDs, and establishing an OOC action checklist comprising a plurality of OOC action check items according to the identified contents;

determining whether the OOC action occurs to a wafer subjected to a current semiconductor production process step, and if the OOC action occurs to the wafer, automatically obtaining a current OCAPID corresponding to the current semiconductor production process step; and inspecting the wafer according to a current identified content corresponding to the current OCAPID.

12. The treatment device for an OOC action during a semiconductor production process of claim 11, wherein said establishing the plurality of OCAPIDs corresponding to the plurality of semiconductor production process steps specifically comprises:
establishing an OCAPID for process items required to be treated by a same Standard Operating Procedure (SOP) in each semiconductor production process step.

13. The treatment device for an OOC action during a semiconductor production process of claim 12, wherein the OCPAID comprises a first part and a second part, the first part being a name of the semiconductor production process step, and the second part being a name of each of the process items required to be treated by the same SOP.

14. The treatment device for an OOC action during a semiconductor production process of claim 12, wherein said establishing the plurality of OCPAIDs corresponding to the plurality of semiconductor production process steps and the plurality of identified contents in one-to-one correspondence with the OCPAIDs, and establishing the OOC action checklist comprising the plurality of OOC action check items according to the identified contents specifically comprises:
establishing the OOC action checklist according to an SOP corresponding to the OCPAIDs, wherein the OOC action checklist comprises a plurality of check items arranged sequentially and a plurality of check sub-items corresponding to each check item;
establishing a plurality of reason classifications in one-to-one correspondence with the plurality of check items in the OOC action checklist; and
establishing an execution action list that corresponds to each OOC action checklist, the execution action list comprising a plurality of execution actions respectively corresponding to the plurality of reason classifications.

15. The treatment device for an OOC action during a semiconductor production process of claim 11, wherein said determining whether the OOC action occurs to the wafer subjected to the current semiconductor production process step specifically comprises:
determining whether a measurement result of the wafer subjected to the current semiconductor production process is in a threshold range monitored through a Statistical Process Control (SPC) system, and if the measurement result is not in the threshold range, confirming that the OOC action occurs to the wafer subjected to the current semiconductor production process step.

16. The treatment device for an OOC action during a semiconductor production process of claim 15, wherein the processor is configured to execute the stored processor-executable instructions to further perform an operation of:
after confirming that the OOC action occurs to the wafer subjected to the current semiconductor production process step,
displaying related information of the wafer, wherein the related information comprises one or any combination of: a time when occurrence of the OOC action is confirmed, a production process station for which occurrence of the OOC action is confirmed, a measurement station where occurrence of the OOC action is confirmed, a current OCAPID corresponding to the current semiconductor production process step and SPC information of the wafer.

17. The treatment device for an OOC action during a semiconductor production process of claim 14, wherein said inspecting the wafer according to the current identified content corresponding to the current OCAPID specifically comprises:
sequentially performing the OOC action check items in the OOC action checklist, to obtain a target check item resulting in occurrence of the OOC action; and
searching for target reason classification corresponding to the target check item, and performing an execution action corresponding to the target reason classification.

18. The treatment device for an OOC action during a semiconductor production process of claim 11, wherein the processor is configured to execute the stored processor-executable instructions to further perform an operation of:
after inspecting the wafer according to the current identified content corresponding to the current OCAPID,
controlling a Manufacturing Execution System (MES) to perform a corresponding action on the wafer according to an inspection result of the wafer.

19. The treatment device for an OOC action during a semiconductor production process of claim 17, wherein the processor is configured to execute the stored processor-executable instructions to further perform an operation of:
after performing the execution action corresponding to the target reason classification,
storing the current semiconductor production process step, the current OCAPID, the target check item, the target reason classification and the execution action.

20. The treatment device for an OOC action during a semiconductor production process of claim 11, wherein the processor is configured to execute the stored processor-executable instructions to further perform an operation of:
performing statistics collection on historical data of the wafer indicating occurrence of one or more OOC actions in the semiconductor production process steps, wherein the historical data comprises a probability of occurrence of the OOC action of the wafer resulted from each OOC action check item in each semiconductor production process step.

* * * * *